US010365046B2

(12) United States Patent
Bosak et al.

(10) Patent No.: US 10,365,046 B2
(45) Date of Patent: Jul. 30, 2019

(54) SERVER THERMAL MANAGEMENT WITH HEAT PIPES

(71) Applicant: Intel Corporation, Santa Clara, CA (US)

(72) Inventors: Henry C. Bosak, Hillsboro, OR (US); Anthony K. Wong, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 554 days.

(21) Appl. No.: 14/335,611

(22) Filed: Jul. 18, 2014

(65) Prior Publication Data

US 2016/0021791 A1    Jan. 21, 2016

(51) Int. Cl.
| | | |
|---|---|---|
| F28D 15/00 | (2006.01) | |
| H05K 7/20 | (2006.01) | |
| F28D 15/04 | (2006.01) | |
| F28D 15/02 | (2006.01) | |
| B23P 6/00 | (2006.01) | |

(52) U.S. Cl.
CPC ......... *F28D 15/04* (2013.01); *F28D 15/0275* (2013.01); *H05K 7/20809* (2013.01); *F28D 15/0266* (2013.01); *F28D 2015/0216* (2013.01); *H05K 7/20663* (2013.01); *H05K 7/20672* (2013.01)

(58) Field of Classification Search
CPC ........... H05K 7/20672; H05K 7/20681; H05K 7/20663; F28D 15/0266; F28D 15/0275
USPC .................. 165/104.14, 104.26; 29/890.032; 361/700
See application file for complete search history.

(56) References Cited

U.S. PATENT DOCUMENTS 7,327,571 B2 *  2/2008  Giardina .................... G06F 1/20
                                                165/104.26
7,457,118 B1 * 11/2008  French ............... H05K 7/20936
                                                361/679.48

(Continued)

FOREIGN PATENT DOCUMENTS

| JP | S5199476 A | * | 9/1976 |
| JP | 53136749 A | * | 11/1978 |
| JP | 02162754 A | * | 6/1990 |

OTHER PUBLICATIONS

Translation of Japanese Patent Document JP 53136749 A entitles Translation—JP 53136749 A.*

(Continued)

*Primary Examiner* — Paul Alvare
(74) *Attorney, Agent, or Firm* — Schwabe, Williamson & Wyatt, P.C.

(57) ABSTRACT

Embodiments of the present disclosure describe servers having thermal management features and thermal management systems for servers. These embodiments include heat sinks to be thermally coupled by one or more heat pipes to transfer heat from hotter downstream heat sinks to cooler upstream heat sinks in order to distribute thermal loading across multiple devices. In one embodiment a single heat pipe may be used to thermally couple two heat sinks, whereas in other embodiments a modular heat pipe arrangement may be used. Techniques for thermally coupling modular heat pipes to one another such that vapor sections of adjacent heat pipes overlap are also disclosed. Other embodiments may be described and/or claimed.

8 Claims, 6 Drawing Sheets

(56) References Cited

U.S. PATENT DOCUMENTS

| | | | |
|---|---|---|---|
| 2007/0053161 A1* | 3/2007 | Giardina | G06F 1/20 361/700 |
| 2009/0225515 A1* | 9/2009 | Hom | H05K 7/20781 361/701 |
| 2014/0138815 A1* | 5/2014 | Yee | H01L 25/16 257/737 |
| 2015/0208551 A1* | 7/2015 | Davidson | H05K 7/20781 165/80.2 |

OTHER PUBLICATIONS

Translation of Japanese Patent Document JP 02162754 A entitled Translation—JP 02162754 A.*
Translation of Japanese Patent Document JPS5199476A entitled Translation—JPS5199476A.*

* cited by examiner

SERVER THERMAL MANAGEMENT WITH HEAT PIPES

FIELD

Embodiments of the present disclosure generally relate to the field of thermal management for integrated circuit devices and servers, and more particularly, distributive thermal load sharing for integrated circuit devices and servers as well as servers incorporating thermal management features for distributive thermal load sharing.

BACKGROUND

Servers, and in particular microservers, may include multiple compute nodes placed on one or more circuit boards, e.g., server blades, service boards and so forth. These compute nodes may include a system-on-a-chip (SoC) and memory, as well as other supporting elements such as power or voltage regulation modules. Typically, compute nodes may be aligned with one another such that an airflow generated by a fan or other device to cool the compute nodes contacts upstream compute nodes before reaching downstream compute nodes. Such an arrangement may result in the upstream compute nodes raising the temperature of the cooling air flow such that the temperature of the cooling air experienced by the downstream compute nodes may be greater than that experienced by the upstream compute nodes. This may result in less efficient cooling of the downstream compute nodes and differences in operating temperature between the upstream and downstream compute nodes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
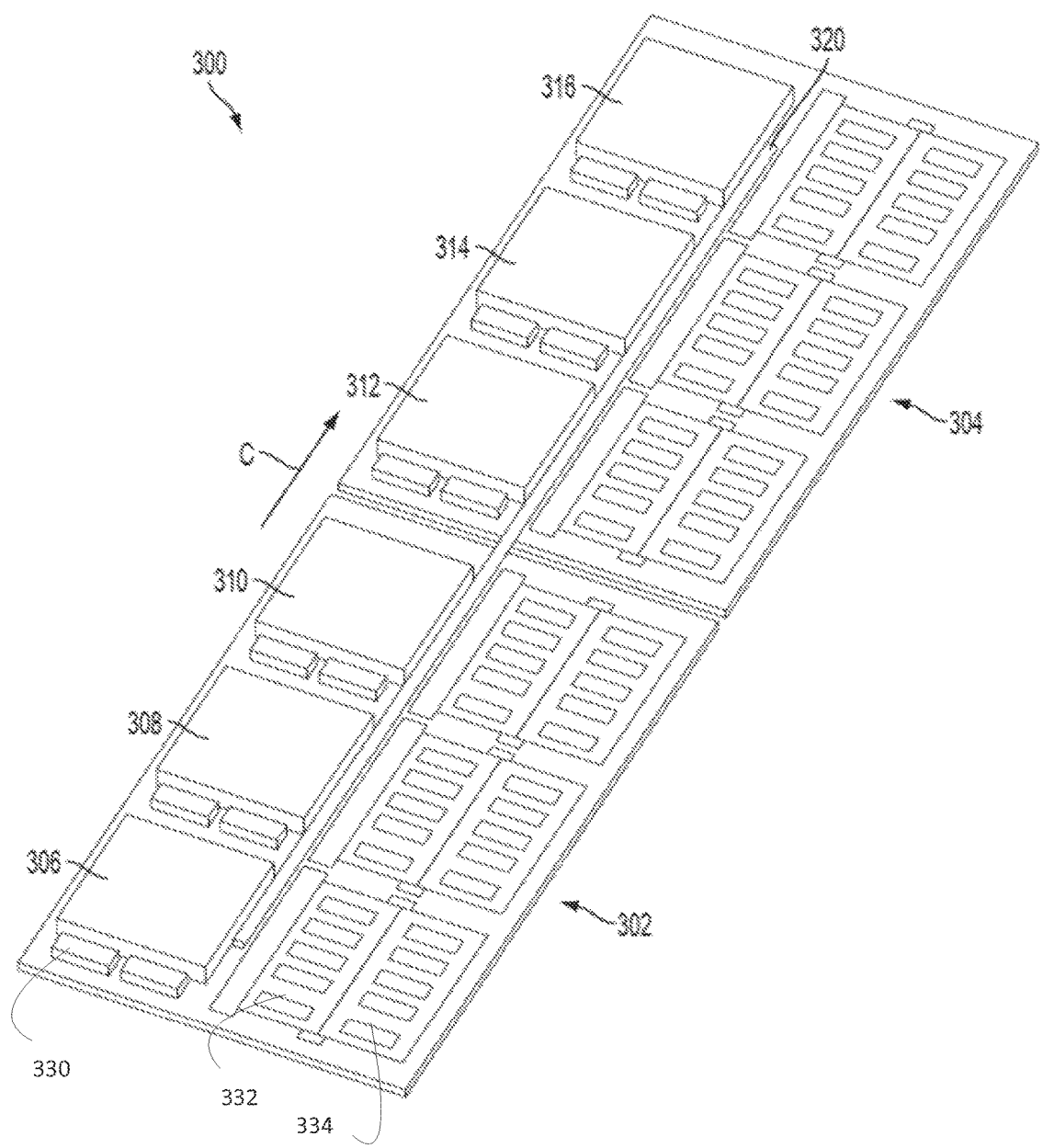
FIG. 1 schematically illustrates a perspective view of a server with multiple modules and multiple nodes relative to a cooling airflow including thermal management features of the present disclosure, in accordance with some embodiments.

Current multi-node servers typically rely upon heat sinks associated with each individual node (e.g., a heat sink coupled to the SoC associated with the node) to cool components and maintain acceptable operating temperatures. When a common cooling airflow is utilized to cool these independent heat sinks downstream nodes may experience less cooling because the cooling air is preheated by the upstream nodes. This may result in higher operating temperatures and possibly decreased performance at the downstream nodes.

Embodiments of the present disclosure describe thermal management features for servers that allow downstream nodes of a server to share their thermal load with upstream nodes in order to distribute thermal load and provide more similar thermal characteristics across the nodes. In particular, heat sinks associated with various nodes may be thermally coupled using heat pipes to transfer thermal energy from hotter heat sinks (e.g., heat sinks associated with downstream nodes) to cooler heat sinks (e.g., heat sinks associated with upstream nodes) in order to distribute the thermal load across the nodes. Particular thermal management systems are also disclosed, including techniques for thermally coupling heat pipes such that the vapor sections of adjacent heat pipes overlap to provide more efficient heat transfer from one heat pipe to another.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-a-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a perspective view of a server 300 with multiple modules and multiple nodes, and thermal management features of the present disclosure, in accordance with some embodiments. Server 300 may have two modules 302 and 304 each associated with a circuit board (not shown). Each module 302, 304 may include 3 nodes (not visible, underneath the heat sinks, e.g. heat sinks 306-310 and 312-316 of the thermal management features of the present disclosure). Each node may include a heat sink 306, 308, 310, 312, 314, and 316 thermally coupled to an SoC (not shown but located between the heat sink and the circuit board). Further, heat sinks 306, 308, 310, 312, 314, and 316 may be configured to be thermally coupled to heat pipe 320 of the thermal management features of the present disclosure. The SoCs may include one or more processors as well as other integrated circuit devices. Each node may also include memory 332, 334 (additional memory devices not labeled for clarity) and a voltage or power regulation module 330. Each node may be configured to perform functions independently of the other nodes, or to collaborate with other nodes in providing server operations. In this instance, each module is shown as including three nodes, but other numbers of nodes may be used in other embodiments and it is not necessary that each module have the same number of nodes.

The server 300 may be cooled, at least in part, by an air flow indicated by arrow C. The air flow may be generated by a fan or other suitable device (not shown) to generate an airflow. The modules 302, 304 may be situated such that a single airflow may be utilized to cool all of the modules. In this arrangement, the airflow will reach module 302 first, followed by module 304. If used without heat pipe 320, this arrangement may result in the temperature of the airflow increasing as it interacts with subsequent modules such that the temperature of the airflow experienced my module 304, and in particular the last node of module 304, being greater than the temperature of the airflow experienced by module 302. Given that heat transfer is proportional to the temperature difference, even if module 302 and module 304 are at the same temperature, module 302 may transfer more energy to the cooling airflow because the lower temperature of the airflow may result in a greater temperature difference. Furthermore, over time the lower heat transfer experienced by module 304 may result in an increased operating temperature further reducing the temperature difference and thus the heat transfer from module 304 to the cooling airflow. However, server 300 in accordance with the present disclosure may be provided with heat pipe 320 which may distribute a thermal load between multiple heat sinks (e.g., as shown between heat sink 316 and heat sink 306; in alternate embodiments, other combinations are possible, additional examples to be described later).

As mentioned above, an airflow, as indicated by arrow C, may be used to cool the nodes. The airflow may be at a temperature that is less than the heat sinks 306, 308, 310, 312, 314, and 316 such that heat is transferred from the heat sinks 306, 308, 310, 312, 314, and 316 to the airflow by convection and removed from the server 300 by way of the moving air.

Accordingly, heat pipe 320 may transfer heat from the hotter downstream heat sink 316 to the cooler upstream heat sink 306 to distribute the thermal load more evenly. The heat pipe 320 may be constituted with heat transfer materials or constituted to hold a heat transfer material. In embodiments, the heat pipe 320 may be constituted to include a vapor portion (discussed in more detail below with reference to FIGS. 5-8) that contains a liquid/vapor mixture. The hot end of heat pipe 320 may be thermally coupled with the base of heat sink 316, while the cold end of heat pipe 320 may be thermally coupled with the base of heat sink 306. Examples of thermal coupling methods include embedded heat pipes or solder attach. At the hot end, in this instance near heat sink 316, the heat pipe 320 may collect heat causing the liquid in the pipe to turn to vapor. The vapor may then travel to the cool end, in this instance near heat sink 306, where the vapor may condense and give off heat. The energy associated with phase transitions of the liquid/vapor may allow the heat pipe 320 to be an effective heat transfer tool. By transferring heat from the downstream heat sink 316 to the upstream heat sink 306, the heat pipe 320 may distribute the thermal load. This may result in an increased temperature at heat sink 306 and a decreased temperature at heat sink 316 as compared to a configuration with no heat pipe. The thermal transfer may also impact the other heat sinks 308, 310, 312, and 314 even though they may not be directly attached to the heat pipe 320. This is because the increase in temperature of the airflow due to the increased temperature of heat sink 306 may impact the heat transfer of each of the downstream heat sinks.

Figure 2:
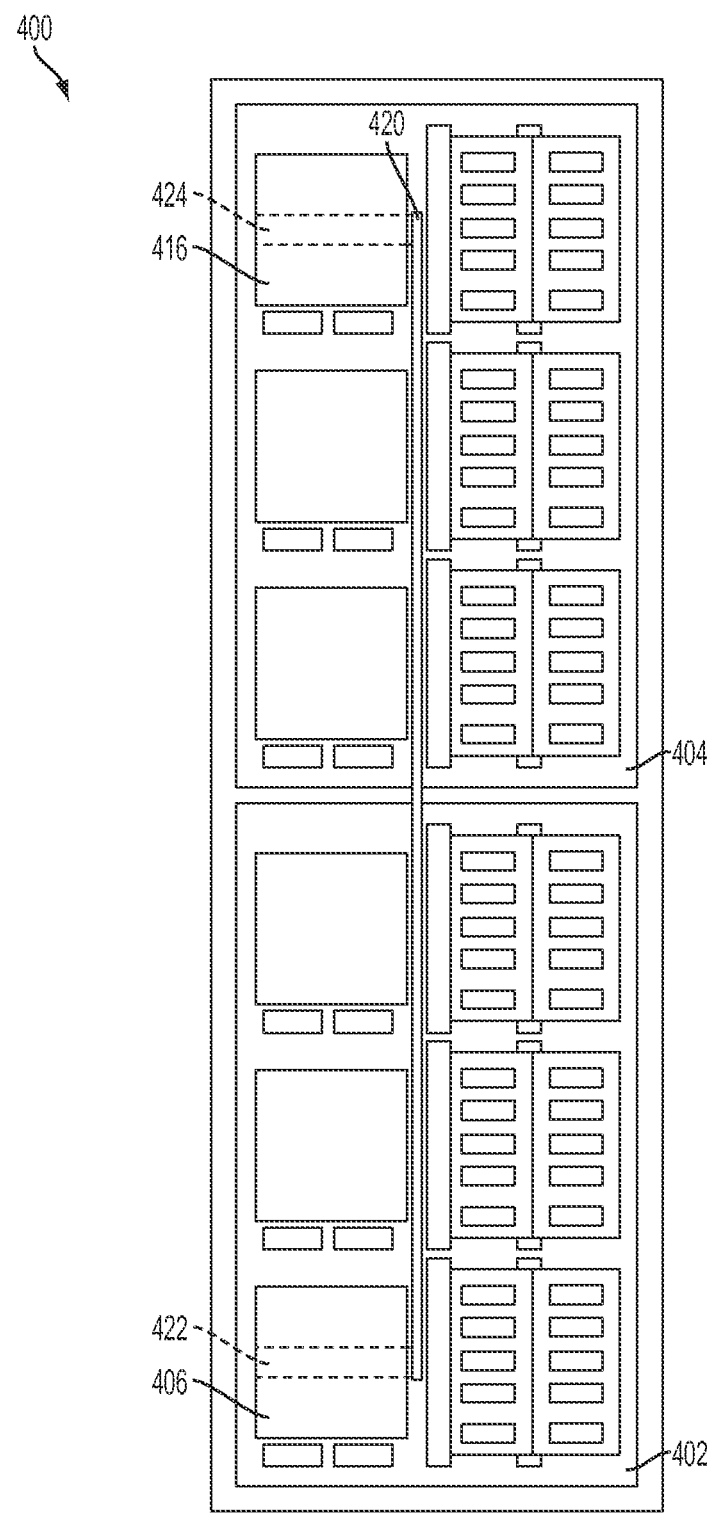
FIG. 2 schematically illustrates a top view of a server with multiple modules and multiple nodes relative to a cooling airflow including thermal management features of the present disclosure, in accordance with some embodiments.

FIG. 2 illustrates a top view of a server 400, consistent with server 300 from FIG. 1. Server 400 may include two modules 402 and 404 each associated with a circuit board (not shown). Each module 402, 404 may include 3 nodes (not visible underneath heat sinks, such as heat sinks 406 and 416 of the thermal management features of the present disclosure). Server 400 may be similar to server 300 and as such only certain elements are labeled for clarity. Server 400 may include a first or upstream heat sink 406 (similar to heat sink 306 in FIG. 1) of the thermal management features of the present disclosure. Server 400 may further include a last or downstream heat sink 416 (similar to heat sink 316 in FIG. 1) of the thermal management features of the present disclosure. As discussed above, each heat sink (i.e., 406, 416) may be associated with an underlying SoC.

Server 400 may further include a heat pipe 420 of the present disclosure, thermally coupling heat sink 416 to heat sink 406. In one embodiment, heat pipe 420 may be bent or angled and contain a heat exchange segment (may also referred to as a hot interface) 424 thermally coupled to heat sink 416. As shown, the hot interface 424 may be thermally coupled to the bottom of heat sink 416, but any thermal coupling arrangement may be used. Examples of thermal coupling of a heat pipe to a heat sink may include an embedded heat pipe or a heat pipe attached to the heat sink with solder. The heat pipe 420 may further include a cool interface 422 thermally coupled to heat sink 406. The hot interface 424 may collect heat from heat sink 416 turning the liquid inside the heat pipe 420 (and specifically hot interface 424) to vapor. The vapor may then travel down the heat pipe 420 to the cold interface 422 where the vapor may condense and heat may be transferred from the heat pipe 420 (and specifically cold interface 422) to the cooler heat sink 406. In other words, in some embodiments, heat pipe 420 may have a elongated U-shape having different regions, with one end (e.g., the end near heat sink 416 having a region where hot interface 424 is disposed, and an opposite end e.g., the end near heat sink 422 having another region where cool interface 422 is disposed.

In another embodiment, three separate heat pipes of the thermal management features of the present disclosure may be utilized. In such an arrangement, rather than hot and cold interfaces 424 and 422 being part of a single heat pipe, they may be independent heat pipes forming a modular heat pipe arrangement. In such an arrangement, separate heat pipes 424 and 422 may each be associated with heat sinks 416 and 406, respectively. In this arrangement heat pipe 424 may transfer heat to heat pipe 420, which may in turn transfer heat to heat pipe 422 and ultimately to heat sink 406. Utilizing modular heat pipes may allow for simpler geometries and lower cost heat pipes to be utilized. Effective techniques for thermally coupling modular heat pipes to one another are discussed in more detail below with reference to FIGS. 5-8. Although discussed as a single heat pipe or a modular system, combinations are also possible. For instance, one of 422 or 424 may be formed as part of heat pipe 420 whereas the other may be an independent heat pipe thermally coupled to the heat pipe 420, thus combining the single heat pipe and modular arrangements. A thermal interface material may be used to improve the conduction of heat through the contact interface between two coupled independent heat pipes.

Figure 3:
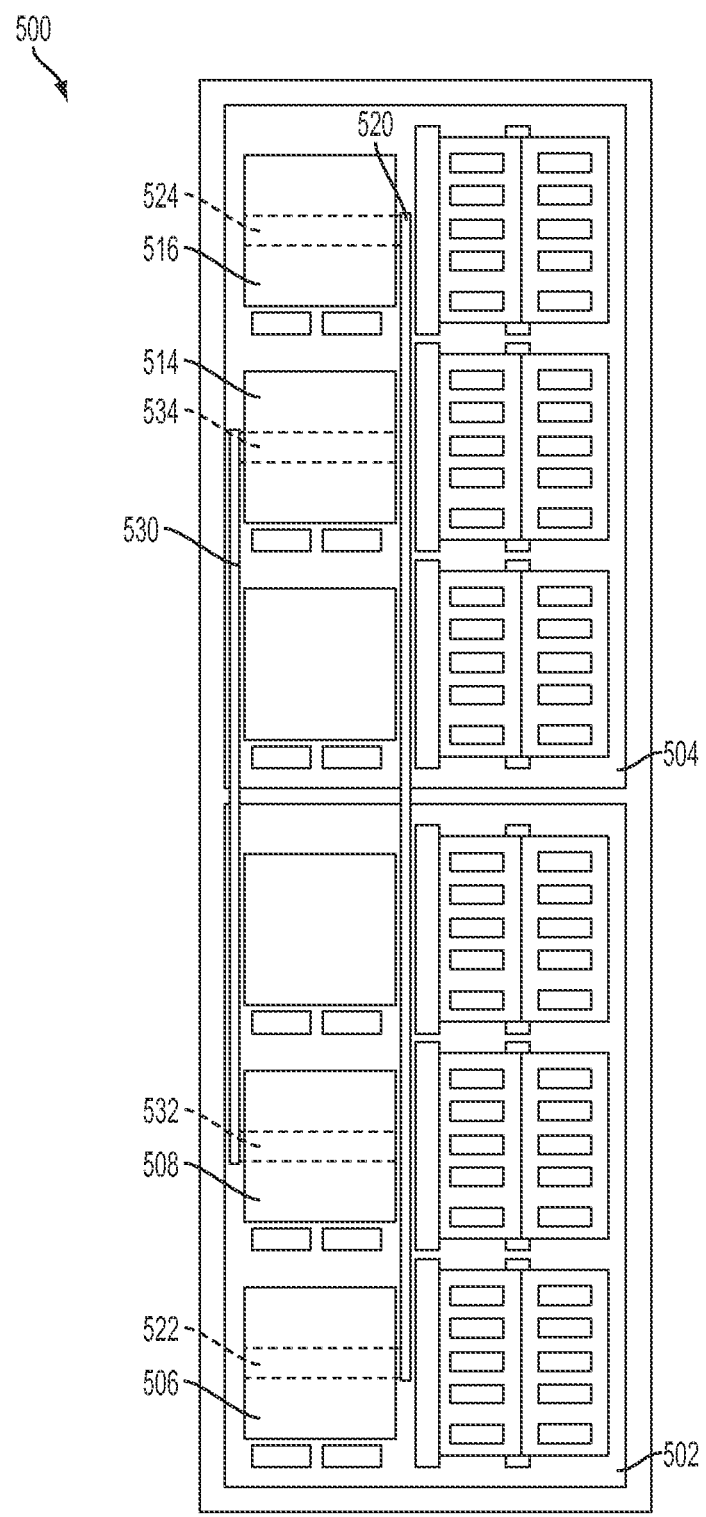
FIG. 3 schematically illustrates a top view of a server relative to a cooling airflow including additional thermal management features of the present disclosure, in accordance with some embodiments.

FIG. 3 is a top view of a server 500 in accordance with some embodiments. Server 500 may include two modules 502 and 504 each associated with a circuit board (not shown). Each module 502, 504 may include 3 nodes (not visible, underneath the heat sinks, e.g. heat sinks 506, 508, 514 and 516 of the thermal management features of the present disclosure). Server 500 may be similar to server 400 and as such only certain elements are labeled for clarity. Server 500 may be provided with a first or upstream heat sink 506 (similar to heat sink 306 in FIG. 1). Server 500 may be further provided with a last or downstream heat sink 516 (similar to heat sink 316 in FIG. 1). Server 500 may be further provided with a second downstream heat sink 514 as well as a second upstream heat sink 508 (similar to heat sinks 314 and 308 in FIG. 1). As discussed above, each heat sink may be associated with an underlying SoC.

Similar to server 400, server 500 may be further provided with a heat pipe 520 of the thermal management features of the present disclosure, thermally coupling heat sink 516 to heat sink 506. This may include either a single heat pipe arrangement or a modular heat pipe arrangement as discussed above. A hot interface 524 (or independent heat pipe in the modular arrangement) may be thermally coupled to heat sink 516 and a cold interface 522 (or independent heat pipe in the modular arrangement) may be thermally coupled to heat sink 506. This arrangement is similar to that discussed above with reference to FIG. 2.

In addition to the heat pipe 520, server 500 may be further provided with an additional heat pipe 530 of the thermal management features of the present disclosure, thermally coupling heat sink 514 to heat sink 508. This too may be a single heat pipe or modular heat pipe arrangement (or a combination thereof). An additional hot interface 534 (or independent heat pipe in the modular arrangement) may be thermally coupled to heat sink 514 and an additional cold interface 532 (or independent heat pipe in the modular arrangement) may be thermally coupled to heat sink 508. In this manner, additional distribution of thermal energy may be achieved by thermally coupling additional heat sinks to one another to shift thermal energy from warmer downstream heat sinks to cooler upstream heat sinks. Although shown in a particular arrangement, other configurations are possible to connect upstream and downstream heat sinks to one another. While the heat pipes 520, 530 are shown located on opposite sides of the heat sinks, other arrangements are possible. For instance, in some embodiments it may be possible to locate both heat pipes along the same line and space them apart from one another vertically. In such an arrangement it may be desirable to thermally couple one set of hot and cold interfaces (or independent heat pipes in the modular arrangement) to the top surface of the respective heat sinks and the other set of hot and cold interfaces (or independent heat pipes in the modular arrangement) to the bottom surface of the respective heat sinks.

Figure 4:
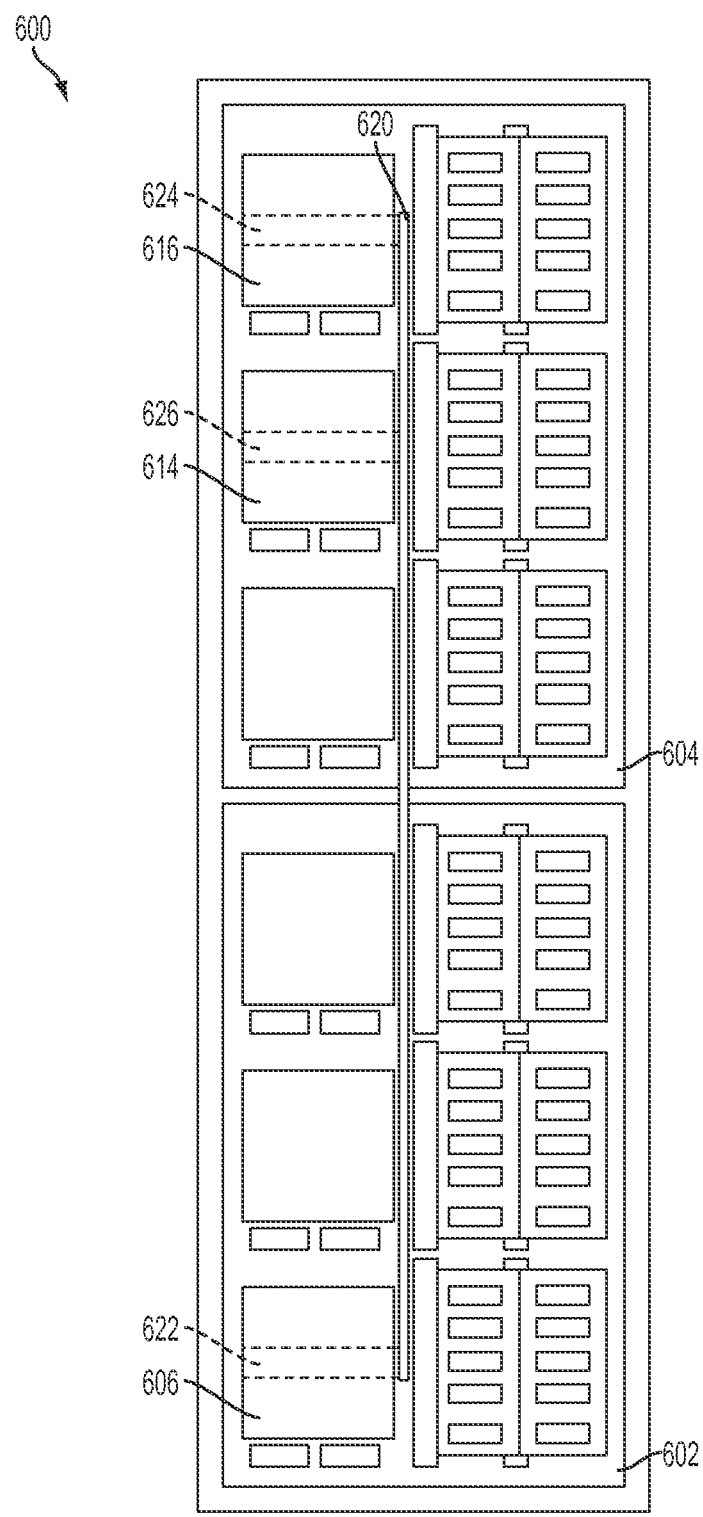
FIG. 4 schematically illustrates a top view of a server relative to a cooling airflow including thermal management features of the present disclosure, in accordance with some embodiments.

FIG. 4 is a top view of a server 600 in accordance with some embodiments. Server 600 may include two modules 602 and 604 each associated with a circuit board (not shown). Each module 602, 604 may include 3 nodes (not visible, underneath the heat sinks, e.g., heat sinks 606, 616 and 616 of the thermal management features of the present disclosure). Server 600 may be similar to server 400 and as such only certain elements are labeled for clarity. Server 600 may be provided with a first or upstream heat sink 606 (similar to heat sink 306 in FIG. 1). Server 600 may be further provided with a last or downstream heat sink 616 (similar to heat sink 316 in FIG. 1). Server 600 may be further provided with a second downstream heat sink 614 (similar to heat sinks 314 in FIG. 1). As discussed above, each heat sink may be associated with an underlying SoC.

Server 600 may further include a heat pipe 620 of the thermal management features of the present disclosure, thermally coupling heat sinks 616 and 614 to heat sink 606. This may include either a single heat pipe arrangement or a modular heat pipe arrangement as discussed above. In this instance, two hotter heat sinks 616, 614 may be thermally coupled to one cooler heat sink 606. Variations of this arrangement are possible including an arrangement where one hot heat sink is thermally coupled to two or more cooler heat sinks. A first hot interface 624 (or independent heat pipe in the modular arrangement) may be thermally coupled to heat sink 616, a second hot interface 626 (or independent heat pipe in the modular arrangement) may be thermally coupled to heat sink 614, and a cold interface 622 (or independent heat pipe in the modular arrangement) may be thermally coupled to heat sink 606. In this manner, thermal energy from two hotter downstream heat sinks (616 and 614) may be transferred to a single cooler upstream heat sink (606). As with earlier described embodiments, in alternate embodiments, heat pipe 620 may couple other combinations of heat sinks.

Figure 5:
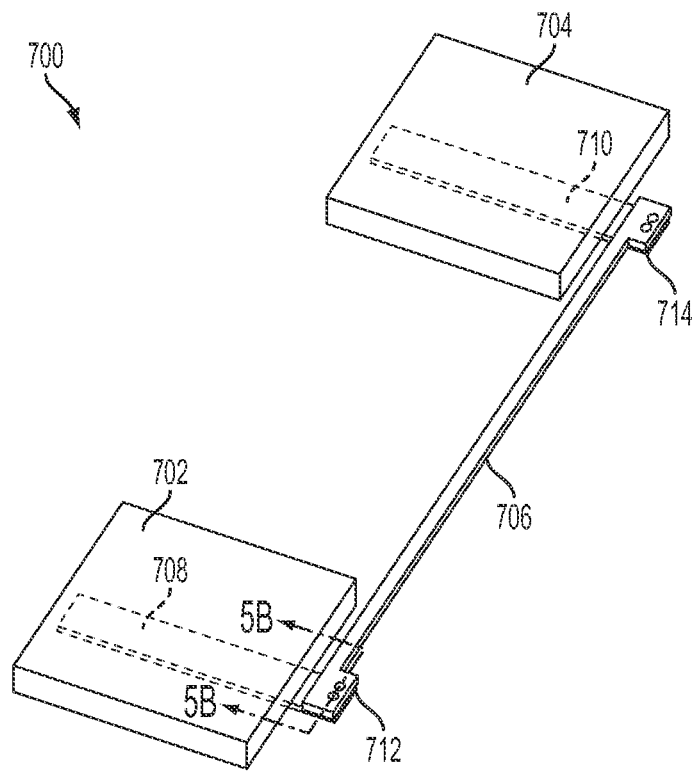
FIG. 5 schematically illustrates a perspective view of a thermal management system for coupling heat sinks in accordance with some embodiments.
Figure 6:
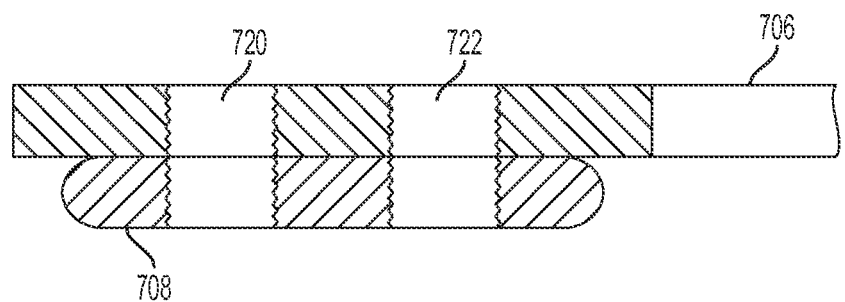
FIG. 6 schematically illustrates a cross-section of coupling components between two heat pipes consistent with FIG. 5 in accordance with some embodiments.

FIG. 5 schematically illustrates a perspective view of a thermal management system 700 for thermally coupling heat sinks in accordance with some embodiments. FIGS. 5-8 correspond to the modular heat pipe arrangements discussed previously. Thermal management system 700 may include a first heat sink 702 and a second heat sink 704. A first heat pipe 708 may be thermally coupled to the first heat sink 702. A second heat pipe 710 may be thermally coupled to the second heat sink 704. The connections between the heat pipes and the heat sinks may be consistent with the examples discussed previously including an embedded heat pipe or a soldered attachment. Depending upon the relative temperatures of the heat sinks 702, 704 the heat pipes 708, 710 may either transfer heat to or from the heat sink to which it is attached. For clarity, the system 700 will be discussed as if heat sink 704 is downstream of heat sink 702 and thus operates at a higher temperature. In this arrangement, the heat pipe 710 may collect heat from the heat sink 704 and transfer it to a third heat pipe 706. The third heat pipe 706 may then transfer the heat to the first heat pipe 708 which may in turn transfer the heat to heat sink 702.

Each heat pipe 708, 710, 706 may also include a coupling portion. For heat pipes 708 and 710 the coupling portion may simply be additional solid material included at the end of the heat pipe beyond the end of the vapor portion. This can be seen in the cross hatched section of heat pipe 708 seen in cross-section FIG. 6. The coupling portions for heat pipe 706 may include structural standoffs 712, 714 formed at either end of heat pipe 706. The long portion of heat pipe 706 may contain the vapor portion surrounded by a relatively thin wall whereas the structural standoffs 712, 714 may be formed from a solid material. This may be seen in more detail in FIG. 6 where the crosshatched portion of heat pipe 706 represents the structural standoff 712. Two threaded holes 720, 722 may be formed through the coupling portions such that heat pipe 706 may be thermally coupled to heat pipe 708 by inserting machine screws or other threaded fasteners into the threaded holes 720, 722. The coupling portions may be provided to provide structural support for the fasteners. Effective heat transfer between the heat pipes may be maintained as the vapor sections may overlap when the two heat pipes are thermally coupled to one other. In some embodiments, a thermal interface material may be included at the interface between the heat pipes to aid conduction. This can be seen best in FIG. 5 where the long portion of heat pipe 706 overlaps the width of heat pipe 708. Only the outermost portion of the coupling section, where the threaded holes 720, 722 are located, may be made of solid material. Thus, the relatively thin walls of the adjacent vapor sections may maintain close contact and facilitate effective heat transfer. This may be more efficient than simply attaching solid metal end sections as conduction from one heat pipe to the other may occur more readily through the relatively thin walls of the vapor sections as compared with the solid structural stand offs.

Figure 7:
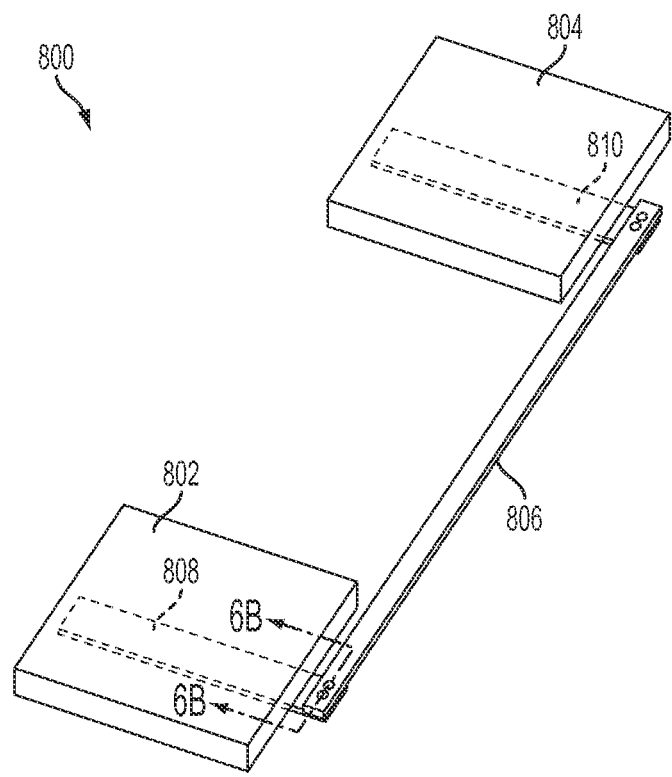
FIG. 7 schematically illustrates a perspective view of a thermal management system for coupling heat sinks in accordance with some embodiments.
Figure 8:
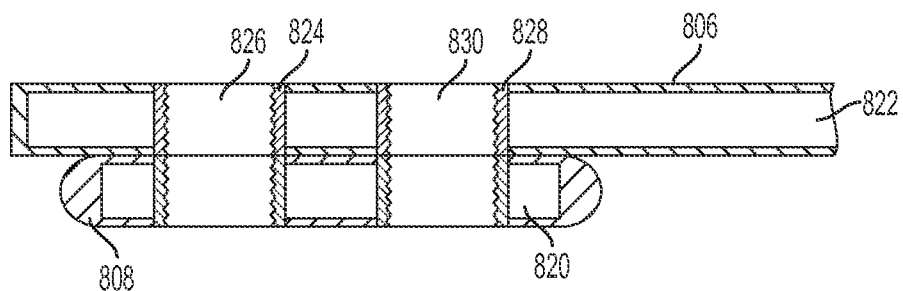
FIG. 8 schematically illustrates a cross-section of coupling components between two heat pipes consistent with FIG. 7 in accordance with some embodiments.

FIGS. 7-8 illustrate another method for thermally coupling heat pipes in the modular arrangement. FIG. 7 shows a thermal management system 800. Similar to system 700, system 800 includes a first heat sink 802 and a second heat sink 804. A first heat pipe 808 may be thermally coupled to the first heat sink 802. A second heat pipe 810 may be thermally coupled to the second heat sink 804. Depending upon the relative temperatures of the heat sinks 802, 804 the heat pipes 808, 810 may either transfer heat to or from the heat sink to which it is attached. A third heat pipe 806 may thermally couple the first and second heat pipes 808, 810 to transfer heat there between. Unlike heat pipe 706 in FIG. 7, heat pipe 806 may not include separate structural standoffs. Instead heat pipe 806 may include coupling portions 824, 828 that protrude through the vapor portions. As discussed above, a thermal interface material may be included at the interface between the heat pipes to aid in conduction.

This can be seen more clearly in FIG. 8. Coupling portions 824, 828 may include cylinders or pillars of solid material that protrude through the vapor portions 822 of heat pipe 806 and 820 of heat pipe 808. The coupling portions 824, 828 may have threaded holes 826 and 830, respectively, formed there through to accept machine screws or other threaded fasteners for thermally coupling the two heat pipes to one another. Similar to FIG. 6 discussed above, it can be seen that the vapor portions of the two heat pipes may overlap which may result in more efficient heat transfer as compared to simply allowing solid structural standoffs to overlap.

EXAMPLES

Some non-limiting examples are provided below.

Example 1 may include an apparatus comprising: a first heat sink to be thermally coupled to a first node of a server; a second heat sink to be thermally coupled to a second node; and a heat pipe to be thermally coupled to the first heat sink and the second heat sink.

Example 2 may include the apparatus of example 1, wherein the heat pipe is a first heat pipe and the apparatus further comprises: a second heat pipe to be thermally coupled to the first heat sink; and a third heat pipe to be thermally coupled to the second heat sink.

Example 3 may include apparatus of example 2, wherein the first heat pipe is to be thermally coupled near a first end to the second heat pipe and thermally coupled near a second end, opposite from the first end, to the third heat pipe.

Example 4 may include the apparatus of example 3, wherein the first heat pipe comprises a vapor portion, and the second heat pipe comprises a vapor portion in contact with the vapor portion of the first heat pipe.

Example 5 may include the apparatus of example 1, wherein the heat pipe may have three regions including: a first region, near a first end, to be thermally coupled to the first heat sink; a second region, near a second end opposite from the first end, to be thermally coupled to the second heat sink; and a third region, to be disposed between the first region and the second region, spanning between the first and second heat sinks.

Example 6 may include the apparatus of example 1, wherein the server is a microserver system, and the apparatus is the microserver system.

Example 7 may include the apparatus of example 6, wherein the first node and the second node each include at least one processor and at least one memory device.

Example 8 may include the apparatus of example 6 further comprising: a third node; and a third heat sink thermally coupled to the third node, wherein the heat pipe is further thermally coupled to the third heat sink.

Example 9 may include an apparatus having thermal management features, comprising: a device to generate an airflow; and a heat pipe to be thermally coupled to a first node and the second node of a server, wherein the device to generate an air flow is disposed such that a flow of air generated by the device reaches the first node before it reaches the second node.

Example 10 may include the apparatus of example 9 further comprising: a second heat pipe to be thermally coupled to a third node and a fourth node of the sever.

Example 11 may include the apparatus of example 10, wherein the third node and the fourth node are disposed between first node and the second node.

Example 12 may include the apparatus of example 11, wherein the first node and the third node are commonly thermally coupled to a circuit board.

Example 13 may include the apparatus of apparatus 12, wherein the server is a microserver system, and the first node and the third node are part of a module of a microserver system.

Example 14 may include the apparatus of example 9, further comprising: a first heat sink to be thermally coupled to the first node; and a second heat sink to be thermally coupled to the second node, wherein the heat pipe is to be thermally coupled to the first node by way of the first heat sink and to the second node by way of the second heat sink.

Example 15 may include the apparatus of example 9, wherein the first node and the second node each include at least one processor and at least one memory device.

Example 16 may include the apparatus of example 9, wherein the first node is coupled to a first circuit board and the second node is coupled to a second circuit board.

Example 17 may include a thermal management system for a server, comprising: a first heat pipe having a first vapor section and a first coupling component, to be coupled to a first node of the server; a second heat pipe having a second vapor section and a second coupling component, to be coupled to a second node of the server; and at least one fastener coupling the first coupling component to the second coupling component, wherein the first vapor section is in contact with the second vapor section.

Example 18 may include the thermal management system of example 17, further comprising: a third heat pipe having third vapor section and a third coupling component; and at least one additional fastener coupling a fourth coupling component associated with the first heat pipe to the third coupling component.

Example 19 may include the thermal management system of example 17, wherein the second heat pipe is to be thermally coupled to a first heat sink.

Example 20 may include the thermal management system of example 19, wherein the third heat pipe is to be thermally coupled to a second heat sink, and wherein the first heat pipe is to transfer heat from the first heat sink to the second heat sink.

Example 21 may include the thermal management system of example 17 wherein the first coupling component may include a structural standoff spaced from the first vapor section.

Example 22 may include the thermal management system of example 17 wherein the first coupling component extends through the first vapor section.

Example 23 may include a thermal management system for a server, comprising: a first heat sink to be thermally coupled to a first node of the server; a second heat sink to be thermally coupled to a first node of the server; and a heat pipe having three regions including: a first region, near a first end, thermally coupled to the first heat sink; a second region, near a second end opposite from the first end, thermally coupled to the second heat sink; and a third region, disposed between the first region and the second region, spanning between the first and second heat sinks.

Example 24 may include the thermal management system of example 23, further comprising: a third heat sink; a fourth heat sink; and a second heat pipe to be thermally coupled to the third heat sink and the fourth heat sink.

Example 25 may include thermal management system of example 24, wherein the second heat pipe may have three regions including: a first region, near a first end, to be thermally coupled to the third heat sink; a second region, near a second end opposite from the first end, to be thermally coupled to the fourth heat sink; and a third region, disposed between the first region and the second region, spanning between the third and fourth heat sinks.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus having thermal management features, comprising:
    a first heat sink directly coupled to a first computing node disposed at a first end of a circuit board of a server;
    a second heat sink directly coupled to a second computing node disposed at a second end of the circuit board opposite the first end; and
    a third heat sink directly coupled to a third computing node disposed in between the first computing node and the second computing node,
    a fourth heat sink directly coupled to a fourth computing node disposed in between the first computing node and the second computing node;
    a fifth heat sink directly coupled to a fifth computing node disposed in between the first computing node and the second computing node; and
    a sixth heat sink directly coupled to a sixth computing node disposed in between the fourth computing node and the fifth computing node;
    a first heat pipe directly coupled to the first heat sink and the second heat sink, wherein the first heat pipe originates at the first heat sink, bypasses the third heat sink, the fourth heat sink, the fifth heat sink and the sixth heat sink, and terminates at the second heat sink to distribute a thermal load between the first heat sink and the second heat sink; and a second heat pipe directly coupled to the fourth heat sink and the fifth heat sink, wherein the second heat pipe originates at the fourth heat sink, bypasses the third heat sink and the sixth heat sink and terminates at the fifth heat sink to distribute a thermal load between the fourth heat sink and the fifth heat sink;

wherein the first, second, third, fourth, fifth and sixth computing nodes are disposed in a single row, the first heat pipe is disposed adjacent to a first side of the row, and the second heat pipe is disposed adjacent to a second side of the row, wherein the second side is opposite to the first side.

2. The apparatus of claim 1, wherein the circuit board is part of a microserver system.

3. The apparatus of claim 2, wherein the first computing node and the second computing node each include at least one processor and at least one memory device.

4. The apparatus of claim 1, wherein the first heat pipe has three regions including:

a first region, near the first end, directly coupled to the first heat sink;

a second region, near the second end opposite from the first end, directly coupled to the second heat sink; and a third region, disposed between the first region and the second region, spanning between the first and second heat sinks.

5. The apparatus of claim 1, wherein the second heat pipe has three regions including:

a first region, near the first end, directly coupled to the fourth heat sink;

a second region, near the second end opposite from the first end, directly coupled to the fifth heat sink; and a third region, disposed between the first region and the second region, spanning between the fourth and fifth heat sinks.

6. The apparatus of claim 1, wherein at least one of the computing nodes or each of the computing nodes is a System on Chip.

7. The apparatus of claim 1, wherein during operation, the first end of the circuit board is hotter than the second end of the circuit board.

8. The apparatus of claim 1, wherein the third, fourth, fifth and sixth nodes are disposed between the first heat pipe and the second heat pipe.

\* \* \* \* \*